(12) United States Patent
Kageyama

(10) Patent No.: US 8,718,527 B2
(45) Date of Patent: May 6, 2014

(54) LASER FIXING DEVICE, IMAGE FORMING APPARATUS EQUIPPED WITH THE LASER FIXING DEVICE, AND IMAGE FORMING METHOD EMPLOYING THE IMAGE FORMING APPARATUS

(75) Inventor: Hiroyuki Kageyama, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 520 days.

(21) Appl. No.: 13/053,391

(22) Filed: Mar. 22, 2011

(65) Prior Publication Data

US 2011/0236821 A1 Sep. 29, 2011

(30) Foreign Application Priority Data

Mar. 26, 2010 (JP) ................... 2010-073846

(51) Int. Cl.
*G03G 15/20* (2006.01)
(52) U.S. Cl.
CPC ...... *G03G 15/2007* (2013.01); *G03F 2215/209* (2013.01)
USPC .......................................... 399/336; 399/337
(58) Field of Classification Search
CPC ............ G03G 15/2007; G03G 15/201; G03G 15/2064; G03G 2215/209
USPC .................................................. 399/336, 337
See application file for complete search history.

(56) References Cited

U.S. PATENT DOCUMENTS

| 7,087,354 B2 | 8/2006 | Nakamura et al. | |
| 7,092,664 B2 * | 8/2006 | Bartscher et al. | 399/336 |
| 2002/0106227 A1 | 8/2002 | Rohde et al. | |
| 2008/0101832 A1 | 5/2008 | Yaoi et al. | |
| 2011/0103816 A1 * | 5/2011 | Mitsuoka | 399/336 |

FOREIGN PATENT DOCUMENTS

| JP | 06-175175 A | 6/1994 |
| JP | 07-191560 A | 7/1995 |
| JP | 11-038802 A | 2/1999 |
| JP | 2004-157157 A | 6/2004 |
| JP | 2005-115194 A | 4/2005 |
| JP | 2008-089828 A | 4/2008 |
| JP | 2008-107576 A | 5/2008 |
| JP | 2010-170059 A | 8/2010 |

\* cited by examiner

*Primary Examiner* — David Gray
*Assistant Examiner* — Laura Roth
(74) *Attorney, Agent, or Firm* — Renner, Otto, Boisselle & Sklar, LLP

(57) ABSTRACT

There are provided a laser fixing device adapted to use of two types of light fixable toners having different light absorption characteristics, an image forming apparatus equipped with the laser fixing device, and an image forming method employing the image forming apparatus. A laser fixing device includes a laser light emitting section for emitting laser light and a wavelength conversion section for emitting outgoing light having a wavelength different from the one that incident laser light has.

2 Claims, 7 Drawing Sheets

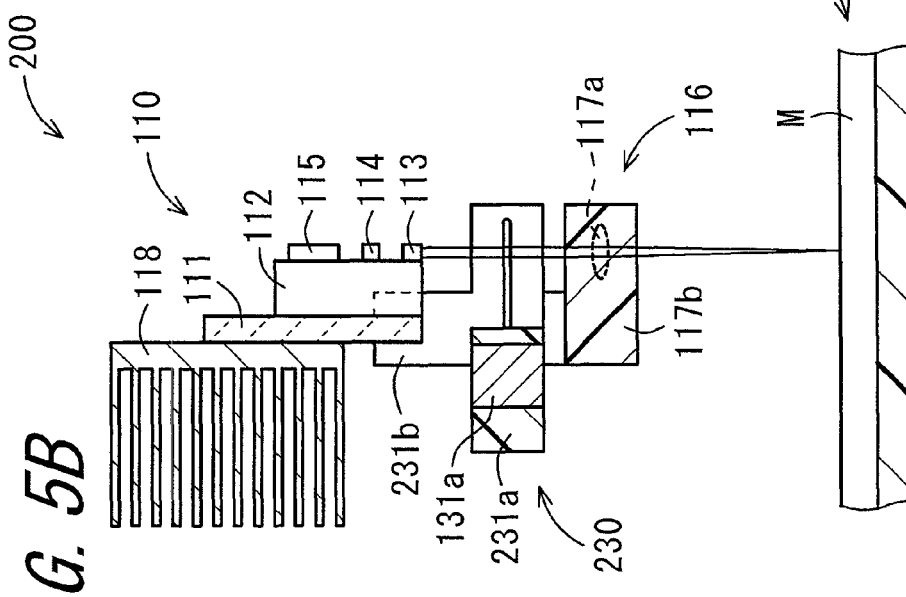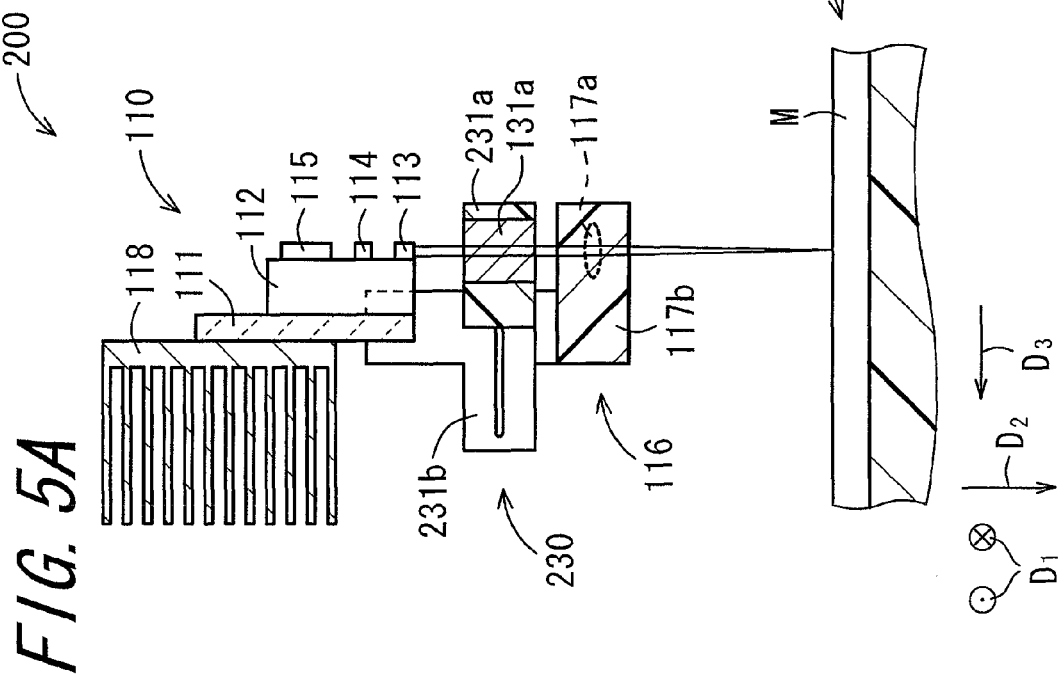

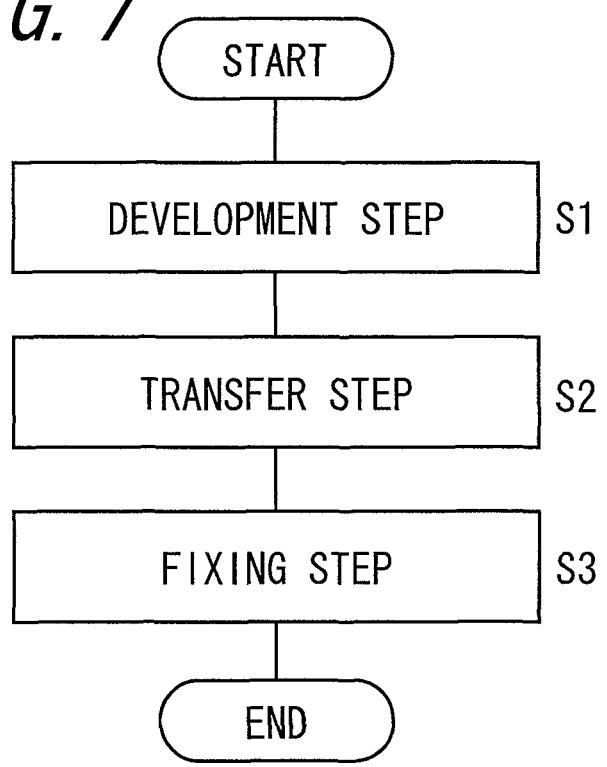

LASER FIXING DEVICE, IMAGE FORMING APPARATUS EQUIPPED WITH THE LASER FIXING DEVICE, AND IMAGE FORMING METHOD EMPLOYING THE IMAGE FORMING APPARATUS

CROSS-REFERENCE TO RELATED APPLICATION

This application claims priority to Japanese Patent Application No. 2010-073846, which was filed on Mar. 26, 2010, the contents of which are incorporated herein by reference in its entirety.

BACKGROUND OF THE INVENTION

1. Field of the Invention

The present invention relates to a laser fixing device, an image forming apparatus equipped with the laser fixing device, and an image forming method employing the image forming apparatus.

2. Description of the Related Art

An electrophotographic image forming apparatus (such for example as a printer) is equipped with a fixing device for fixing an image onto a recording sheet. The fixing device causes a toner constituting a toner image formed on a recording sheet to melt, thereby fixing the toner image onto the recording sheet.

As an example of such a fixing device, there is known a fixing device of heat-roller fixing type comprising a fixing roller and a pressure section, such as described in Japanese Unexamined Patent Publication JP-A 11-38802 (1999). In this heat-roller type fixing device, a recording sheet bearing a yet-to-be-fixed toner image is sandwiched between the fixing roller having a heating portion thereinside and the pressure section which is brought into pressure-contact with the fixing roller. In this way, the toner borne on the recording sheet is fused on the recording sheet.

In such a heat-roller type fixing device, the surface temperature of the fixing roller needs to be raised to a predetermined level by the heating portion to fuse the toner under application of heat. Therefore image formation cannot be effected immediately upon start-up of the apparatus, and a certain amount of time is required to be ready for image formation. Furthermore, when it is desired to keep the surface of the fixing roller at a predetermined temperature for immediate image formation, the surface of the fixing roller needs to be heated continuously, which results in an increase in energy consumption.

In view of the foregoing, as a fixing device capable of fixing toner images without spending much time while suppressing an increase in energy consumption, there is proposed an optical fixing device for fusing and fixing a toner by exploiting optical energy.

In Japanese Unexamined Patent Publication JP-A 7-191560 (1995), as an optical fixing device, there is shown a laser fixing device having an array of a plurality of laser light emitting devices for applying laser light to a toner. According to the laser fixing device described in JP-A 7-191560, in contrast to a laser fixing device having a single laser light emitting device only, there is no need to cause laser light reflection by means of a polygon mirror or otherwise. It will thus be seen that the laser fixing device can be made compact.

In addition, in Japanese Unexamined Patent Publication JP-A 2005-115194, as an optical fixing device, there is shown a flash fixing device for fusing a toner by means of flash light having wavelengths ranging from 800 nm to 1000 nm. In JP-A 2005-115194, as a light fixable toner, there is shown an infrared-fixable toner containing an infrared absorbing agent having an absorption peak wavelength within a range of from 800 nm to 1000 nm in terms of light absorption characteristics.

Examples of the light fixable toner includes, in addition to the infrared-fixable toner, a visible light-fixable toner configured to be fused and fixed by visible light and an ultraviolet-fixable toner configured to be fused and fixed by ultraviolet light. These light fixable toners differ from one another not only in light absorption characteristic but also in the quality of obtained images. For example, given that an image is formed by using the infrared-fixable toner, since the infrared absorbing agent even absorbs visible light in a range near the infrared region, it follows that the obtained image suffers a decline in color reproducibility in its red-color area. It is therefore desirable to select a light fixable toner for use appropriately according to purposes.

What must be necessary for appropriate use of a light fixable toner as the situation demands is an optical fixing device and an image forming apparatus as well adapted to use of a plurality of types of light fixable toners having different light absorption characteristics. In this respect, there is a problem in the optical fixing devices disclosed in JP-A 7-191560 and JP-A 2005-115194 in that these optical fixing devices are designed to deal with only one light fixable toner.

SUMMARY OF THE INVENTION

The invention has been devised to overcome the problem as mentioned supra, and accordingly its object is to provide a laser fixing device adapted to use of two types of light fixable toners having different light absorption characteristics, an image forming apparatus equipped with the laser fixing device, and an image forming method employing the image forming apparatus.

The invention provides a laser fixing device adapted to use of two types of light fixable toners having different light absorption characteristics, comprising:

a laser light emitting section for emitting laser light; and a wavelength conversion section for emitting outgoing light having a wavelength different from the one that incident laser light has, the laser light being applied to one of the two light fixable toners and the outgoing light which is emitted from the wavelength conversion section being applied to the other toner.

According to the invention, two types of light having different wavelengths can be applied to their respective light fixable toners by the laser light emitting section and the wavelength conversion section. This makes it possible to provide a laser fixing device capable of fusing and fixing two types of light fixable toners having different light absorption characteristics.

Moreover, it is preferable that the laser light emitting section is configured to emit an infrared ray as the laser light.

According to the invention, at least an infrared-fixable toner can be fused and fixed through irradiation of an infrared ray effected by the laser light emitting section.

Moreover, it is preferable that the wavelength conversion section is configured to emit an ultraviolet ray as the outgoing light emitted from the wavelength conversion section.

According to the invention, at least an ultraviolet-fixable toner can be fused and fixed through irradiation of an ultraviolet ray emitted from the wavelength conversion section.

Moreover, it is preferable that the wavelength conversion section is an SHG element employing quasi phase matching.

According to the invention, an ultraviolet ray can be emitted by the SHG element employing quasi phase matching.

Moreover, it is preferable that the laser fixing device further comprises a conveying section for conveying a recording medium to a location which is irradiated with the laser light and the outgoing light emitted from the wavelength conversion section, and the conveying section exhibits, at least at its part irradiated with the laser light and the outgoing light emitted from the wavelength conversion section, an infrared transmittance of greater than or equal to 70% and an ultraviolet transmittance of greater than or equal to 80%.

According to the invention, that part of the conveying section which is irradiated with light exhibits an infrared transmittance of greater than or equal to 70% and an ultraviolet transmittance of greater than or equal to 80%. Accordingly, the conveying section is resistant to light-induced quality degradation even under application of both an infrared ray and an ultraviolet ray, and can thus be used for a longer period of time.

Moreover, the invention further provides an electrophotographic image forming apparatus configured so that a light fixable toner is fixed onto a recording medium by the laser fixing device mentioned above.

According to the invention, there is provided an image forming apparatus which is adapted to use of two types of light fixable toners having different light absorption characteristics with the provision of the laser fixing device.

Moreover, the invention further provides an image forming method for forming an image by using the image forming apparatus mentioned above and a light fixable toner containing a light absorbing material which absorbs light emitted from the laser fixing device mentioned above, comprising:

a development step of forming a light fixable toner image on an image bearing member disposed in the image forming apparatus by a developing device disposed in the image forming apparatus;

a transfer step of transferring the light fixable toner image formed in the development step onto a recording medium by a transfer section disposed in the image forming apparatus; and a fixing step of fusing and fixing the light fixable toner constituting the light fixable toner image on the recording medium by applying at least one of the laser light and outgoing light emitted from the wavelength conversion section to the light fixable toner image borne on the recording medium by means of the laser fixing device.

According to the invention, there is provided an image forming method which is adapted to use of two types of light fixable toners having different light absorption characteristics with the provision of the fixing step of fixing the light fixable toner by using the laser fixing device.

Moreover, it is preferable that the light absorbing material is one or two or more of those selected from among polyimide, polyethylene sulfide, polyethylene naphthalate, polymethyl methacrylate, and polycarbonate.

According to the invention, the light absorbing material is one or two or more of those selected from among polyimide, polyethylene sulfide, polyethylene naphthalate, polymethyl methacrylate, and polycarbonate. Accordingly, where at least one of the laser light and the outgoing light is a near-ultraviolet ray, it is possible to obtain an image which exhibits high fixation strength.

Moreover, it is preferable that the light absorbing material is a resin material having an ultraviolet absorbing group.

According to the invention, the light absorbing material is a resin material having an ultraviolet absorbing group. Accordingly, where at least one of the laser light and the outgoing light is a near-ultraviolet ray, it is possible to obtain an image which exhibits high fixation strength.

Moreover, it is preferable that, when an image is formed by putting a light fixable toner of black color and a light fixable toner of another color on top of each other, in the transfer step, transfer is so performed that the light fixable toner of another color is overlaid upstream of the light fixable toner of black color in a direction of light irradiation set for the fixing step.

According to the invention, in the transfer step, transfer is so performed that the light fixable toner of a color other than black is overlaid upstream of the light fixable toner of black color in the direction of light irradiation. This makes it possible to apply light which is relatively high in intensity to the light fixable toner of a color other than black having a relatively low light absorption efficiency, and therefore it is possible to fix the light fixable toner of a color other than black properly. Since the light fixable toner of black color has a relatively high light absorption efficiency, even if light applied thereto is relatively low in intensity, it is possible to fix the light fixable toner of black color properly.

BRIEF DESCRIPTION OF THE DRAWINGS

Other and further objects, features, and advantages of the invention will be more explicit from the following detailed description taken with reference to the drawings wherein:

FIGS. 5A and 5B are schematic views showing a laser fixing device;

FIG. 7 is a flowchart for explaining an image forming method according to the invention.

DETAILED DESCRIPTION

Figure 1:
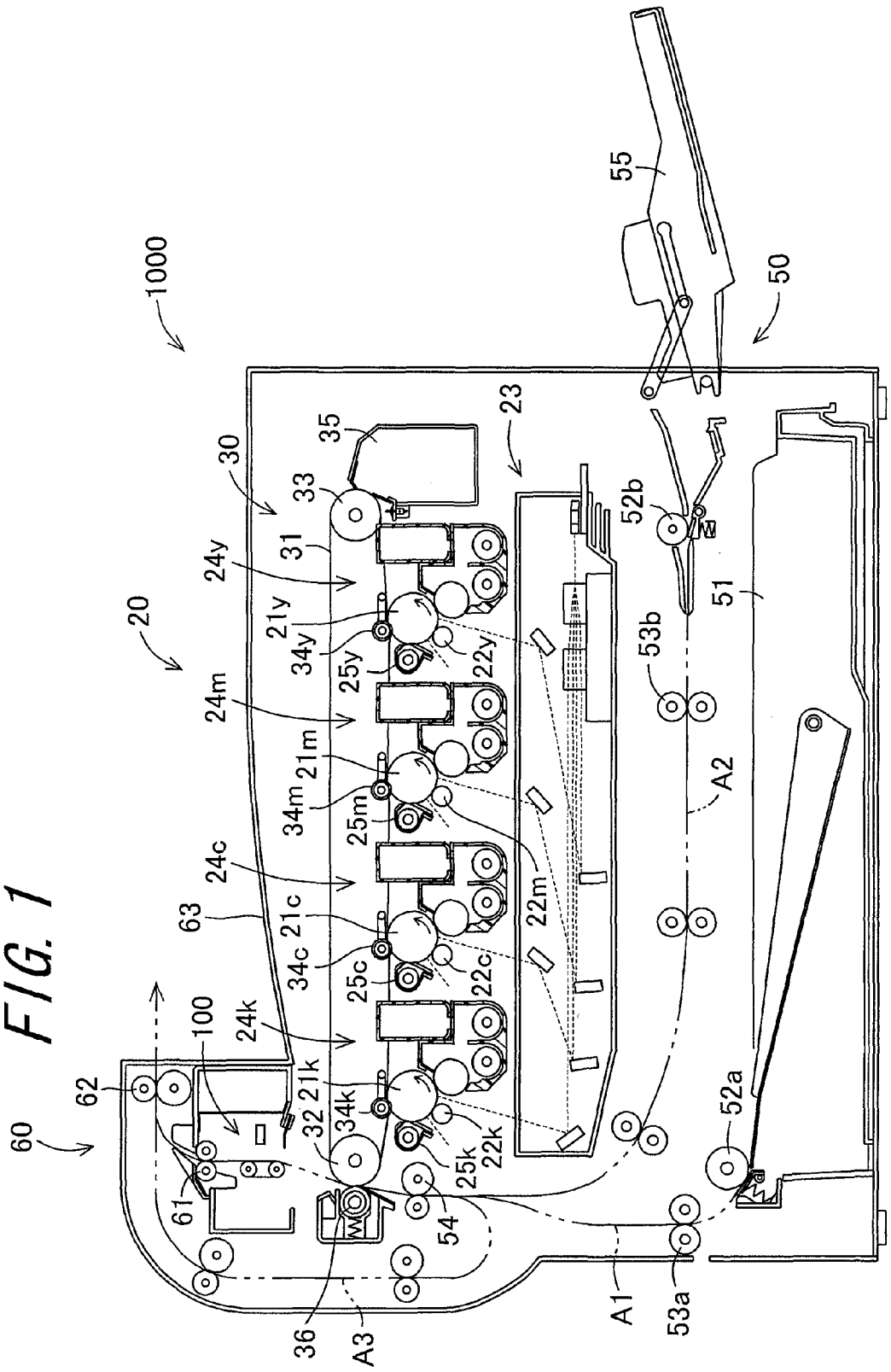
FIG. 1 is a schematic view showing the structure of an image forming apparatus.

Now referring to the drawings, preferred embodiments of the invention will be described in detail.

Figure 2:
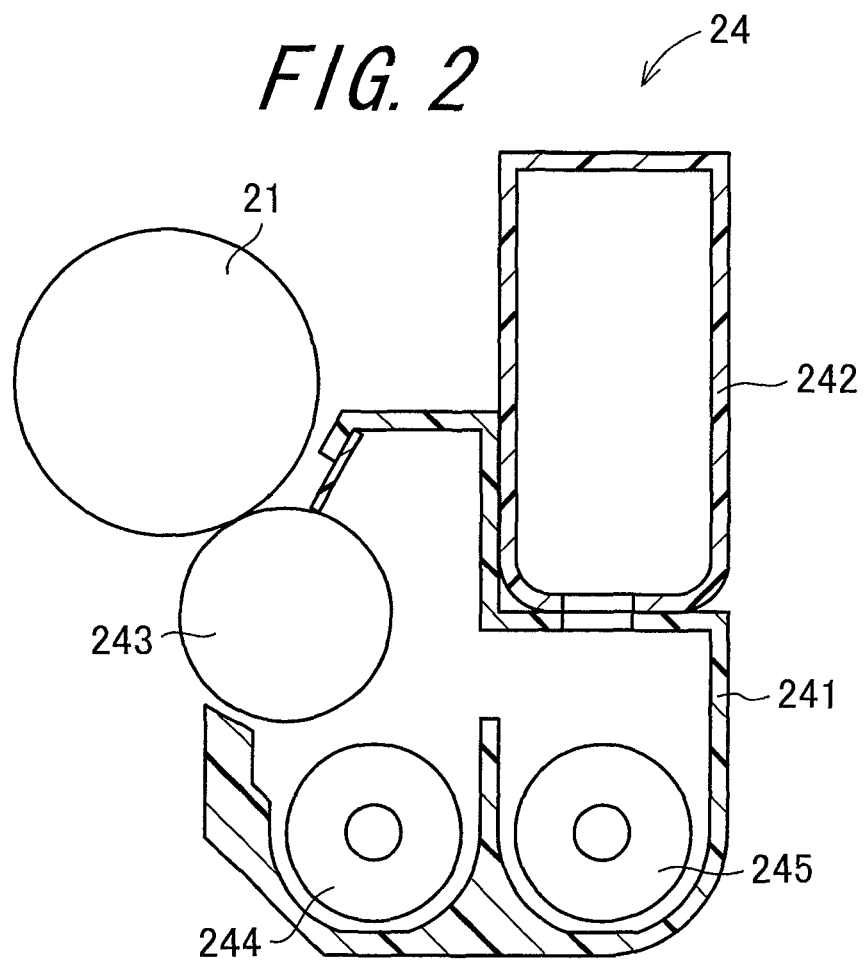
FIG. 2 is a schematic view showing the structure of a developing device provided in the image forming apparatus.

To begin with, an image forming apparatus 1000 equipped with a laser fixing device 100 according to a first embodiment of the invention will be described. FIG. 1 is a schematic view showing the structure of the image forming apparatus 1000. FIG. 2 is a schematic view showing the structure of a developing device 24 provided in the image forming apparatus 1000. The image forming apparatus 1000, which is built as a multi-functional peripheral having a copier function, a printer function, and a facsimile function, acts to form a full-color or monochromatic image on a recording medium in response to image information transmitted thereto. That is, the image forming apparatus 1000 has three printing modes, namely a copier mode (duplicator mode), a printer mode, and a facsimile mode. In this construction, for example, in response to operation input from an operating section (not shown) and receipt of a print job from a personal computer, a portable terminal unit, an information recording/storage medium, and external equipment using a memory device, a printing mode is selected by a control unit section (not shown).

The image forming apparatus 1000 includes a toner image forming section 20, a transfer section 30, the laser fixing device 100, a recording medium supply section 5, a discharge section 60, and the control unit section (not shown). The toner image forming section 20 includes photoreceptor drums 21*k*, 21*c*, 21*m*, and 21*y*, charging sections 22*k*, 22*c*, 22*m*, and 22*y*, an exposure unit 23, developing devices 24*k*, 24*c*, 24*m*, and 24*y*, and cleaning units 25*k*, 25*c*, 25*m*, and 25*y*. The transfer section 30 includes an intermediate transfer belt 31, a driving roller 32, a driven roller 33, intermediate transfer rollers 34*k*, 34*c*, 34*m*, and 34*y*, a transfer belt cleaning unit 35, and a transfer roller 36.

In order to deal with pieces of image information on different colors, namely black (k), cyan (c), magenta (m), and yellow (y) included in color image information on an individual basis, the photoreceptor drum 21, the charging section 22, the developing device 24, the cleaning unit 25, and the intermediate transfer roller 34 are each correspondingly four in number. In this specification, as to the four members of one kind provided for adaptability to different colors, collectively, they are designated only by the same general reference numeral, but, when distinctions are drawn among these members according to their respective colors, they are designated by the general reference numeral with the alphabetical suffix indicative of specific color.

The photoreceptor drum 21 is an image bearing member comprising a conductive substrate and a photosensitive layer (not shown) formed on the surface of the conductive substrate. The conductive substrate is, for example, a cylindrical or columnar member which is supported so as to be rotatable about its axis by a driving portion (not shown). The photosensitive layer is a member which exhibits electrical conductivity under irradiation of light. For example, the photosensitive layer is composed of a charge generating layer containing a charge generating substance and a charge transporting layer containing a charge transporting substance which are stacked on top of each other. On the surface of the photosensitive layer is formed an electric image called an electrostatic latent image through a charging process by the charging section 22 and an exposure process by the exposure unit 23. The electrostatic latent image formed on the surface of the photosensitive layer is developed by the developing device 24, whereby a toner image is formed on the surface of the photosensitive layer.

The charging section 22 is a charging device for charging the surface of the photoreceptor drum 21 to a predetermined potential with a predetermined polarity. The charging section 22 is disposed at a position facing the photoreceptor drum 21 so as to extend along a longitudinal direction of the photoreceptor drum 21. The charging section 22 is placed in contact with the surface of the photoreceptor drum 21 when a contact charging system is adopted, and yet is placed away from the surface of the photoreceptor drum 21 when a non-contact charging system is adopted.

The charging section 22 is, along with the developing device 24 and the cleaning unit 25, disposed around the photoreceptor drum 21. The charging section 22, the developing device 24, and the cleaning unit 25 are arranged around the photoreceptor drum 21 in the order named along the direction of rotation of the photoreceptor drum 21. The charging section 22 is placed vertically below the developing device 24 and the cleaning unit 25. It is preferable that the charging section 22 lies closer to the photoreceptor drum 21, compared with the developing device 24 as well as the cleaning unit 25. This makes it possible to prevent occurrence of a charging failure on the photoreceptor drum 21 without fail.

As the charging section 22, a charging device of brush type, a charging device of roller type, a corona discharge device, an ion production device, or the like can be used. The brush-type charging device and the roller-type charging device are each a charging device adapted for the contact charging system. Some brush-type charging devices employ a charging brush, and others employ a magnetic brush, for example. The corona discharge device and the ion production device are each a charging device adapted for the non-contact charging system. Some corona discharge devices employ a wire-type discharge electrode, others employ a pin array-type discharge electrode, and still others employ a stylus-type electrode, for example.

The exposure unit 23 is a unit for irradiating the surfaces of the photoreceptor drums 21*k*, 21*c*, 21*m*, and 21*y* in a charged state with light corresponding to image information of different colors, respectively, to form electrostatic latent images corresponding to the image information of the respective colors on the surfaces of the photoreceptor drums 21*k*, 21*c*, 21*m*, and 21*y*. The exposure unit 23 is so placed that light emitted therefrom passes through a region between the charging section 22 and the developing device 24 to be shone on the surface of the photoreceptor drum 21. As the exposure unit 23, for example, a laser scanning unit (LSU) having a laser light emission device and a plurality of reflection mirrors can be used. It is also possible to use a unit constructed by combining an LED (Light Emitting Diode) array, a liquid crystal shutter, and a light source properly as the exposure unit 23.

The developing device 24 includes a developer tank 241 and a toner hopper 242. The developer tank 241 accommodates a developer containing a toner which is fixable onto a recording medium through light irradiation (light fixable toner) in its internal space. The light fixable toner will be explained later on. Within the developer tank 241, a developing roller 243, a first conveyor screw 244, and a second conveyor screw 245 are rotatably supported. The developer tank 241 has an opening formed on its side surface opposed to the photoreceptor drum 21. The developing roller 243 is placed in the position of the opening through the photoreceptor drum 21.

The developing roller 243 is a member for supplying the toner to the surface of the photoreceptor drum 21 at a location in the closest proximity to the photoreceptor drum 21. In supplying a toner, on the surface of the developing roller 243 is applied a voltage of a polarity reverse to the polarity of the charge on the toner (development bias). In this way, the toner on the surface of the developing roller 243 is fed to the photoreceptor drum 21 smoothly. It is noted that, by making a change to the value of the development bias, it is possible to control the amount of toner to be fed to the photoreceptor drum 21 (toner attachment amount).

The first conveyor screw 244 is a member placed facing the developing roller 243, for supplying a toner around the developing roller 243. The second conveyor screw 245 is a member placed facing the first conveyor screw 244, for supplying a toner which has just been newly fed into the developer tank 241 from the toner hopper 242, around the first conveyor screw 244. The toner hopper 242 is so disposed that a toner replenishment port (not shown), which is created in a lower part thereof in a vertical direction, communicates with a toner reception port (not shown) created in an upper part of the developer tank 241 in the vertical direction. The toner hopper 242 supplies the toner that it receives from a toner cartridge (not shown) attached to the image forming apparatus 1000 interiorly thereof to the developer tank 241 according to the condition of developer consumption.

The cleaning unit 25 removes, after a toner image has been transferred from the photoreceptor drum 21 to the intermediate transfer belt 31, the toner remaining on the surface of the photoreceptor drum 21 and cleans the surface of the photoreceptor drum 21. For example, the cleaning unit 25 includes a platy member which is abutted against the photoreceptor drum 21 and a container-like member for collecting the removed toner.

According to the toner image forming section 20, the surface of the photoreceptor drum 21 in a state of being uniformly charged by the charging section 22 is irradiated with laser light corresponding to image information emitted from the exposure unit 23, so that an electrostatic latent image can be formed thereon. Then, the toner is fed to the electrostatic latent image from the developing device 24 to form a toner image. The toner image is transferred to the intermediate transfer belt 31 which will hereafter be described. Following the transfer of the toner image to the intermediate transfer belt 31, the toner remaining on the surface of the photoreceptor drum 21 is removed by the cleaning unit 25.

The intermediate transfer belt 31 is an endless belt-shaped member placed vertically above the photoreceptor drum 21. The intermediate transfer belt 31 is supported around the driving roller 32 and the driven roller 33 with tension for turning movement.

The driving roller 32 is so disposed as to be rotatable about its axis by a driving portion (not shown). The intermediate transfer belt 31 is caused to turn by rotation of the driving roller 32. The driven roller 33 is so disposed as to be rotatable in accordance with rotation of the driving roller 32, and generates a constant tension in the intermediate transfer belt 31 so that the intermediate transfer belt 31 does not go slack.

The intermediate transfer roller 34 is so disposed as to come into pressure-contact with the photoreceptor drum 21, with the intermediate transfer belt 31 interposed therebetween, and to be rotatable about its axis by a driving portion (not shown). The intermediate transfer roller 34 is connected with a power source (not shown) for application of a transfer bias, and has the capability of transferring the toner image borne on the surface of the photoreceptor drum 21 to the intermediate transfer belt 31.

The transfer roller 36 is so disposed as to come into pressure-contact with the driving roller 32, with the intermediate transfer belt 31 interposed therebetween, and to be rotatable about its axis by a driving portion (shown). At a pressure-contact region between the transfer roller 36 and the driving roller 32 (transfer nip region), the toner image which has just been conveyed thereto while being borne by the intermediate transfer belt 31 is transferred onto a recording medium fed from a recording medium supply section 50 which will hereafter be described.

The transfer belt cleaning unit 35 is disposed facing the driven roller 33, with the intermediate transfer belt 31 interposed therebetween, and so as to make contact with the toner image-bearing surface of the intermediate transfer belt 31. When the toner remains adherent to the intermediate transfer belt 31 even after the transfer of the toner image onto the recording medium, the residual toner may adhere to the transfer roller 36 due to the turning of the intermediate transfer belt 31. The toner adherent to the transfer roller 36 results in the soiling of the back side of a recording medium which undergoes transfer subsequently. Accordingly, the transfer belt cleaning unit 35 is mounted to remove and collect the toner adherent to the surface of the intermediate transfer belt 31 following the transfer of the toner image onto the recording medium.

According to the transfer section 30, as the intermediate transfer belt 31 is turned to run while making contact with the photoreceptor drum 21, the intermediate transfer roller 34 receives application of a transfer bias of a polarity reverse to the polarity of the charge on the toner borne on the surface of the photoreceptor drum 21, whereupon the toner image formed on the surface of the photoreceptor drum 21 is transferred onto the intermediate transfer belt 31. In the case of forming a full-color image, the toner images of different colors formed on the photoreceptor drum 21$y$, the photoreceptor drum 21$m$, the photoreceptor drum 21$c$, and the photoreceptor drum 21$k$, respectively, are overlaid one after another in the order named onto the intermediate transfer belt 31, thereby forming full-color toner images. The toner images transferred to the intermediate transfer belt 31 are conveyed, by the turning movement of the intermediate transfer belt 31, to the transfer nip region, and at the transfer nip region, they are transferred to a recording medium. The full-color toner images of black, cyan, magenta and yellow transferred onto the recording medium are overlaid in the order named. The recording medium with the toner images transferred thereon is conveyed to the laser fixing device 100.

The recording medium supply section 50 includes a paper feeding box 51, pick-up rollers 52$a$ and 52$b$, conveying rollers 53$a$ and 53$b$, registration rollers 54, and a paper feeding tray 55. The paper feeding box 51, which is placed in a lower part of the image forming apparatus 1000 in the vertical direction, is a case-like member for storing the recording mediums inside the image forming apparatus 1000. The paper feeding tray 55, which is placed on an outer wall surface of the image forming apparatus 1000, is a tray-like member for storing the recording mediums outside the image forming apparatus 1000. Examples of the recording medium include plain paper, color copy paper, an overhead projector sheet, and a postcard.

The pick-up roller 52$a$ is a member for taking the recording mediums stored in the paper feeding box 51 and feeding them to a paper conveyance path A1 sheet by sheet. The conveying rollers 53$a$ are a pair of roller members arranged in pressure-contact with each other, for conveying the recording medium toward the registration rollers 54 along the paper conveyance path A1. The pick-up roller 52$b$ is a member for taking the recording mediums stored in the paper feeding tray 55 and feeding them to a paper conveyance path A2 sheet by sheet. The conveying rollers 53$b$ are a pair of roller members arranged in pressure-contact with each other, for conveying the recording medium toward the registration rollers 54 along the paper conveyance path A2.

The registration rollers 54 are a pair of roller members arranged in pressure-contact with each other, for conveying the recording medium fed from the conveying rollers 53$a$, 53$b$ to the transfer nip region in synchronism with the conveyance of the toner image borne on the intermediate transfer belt 31 to the transfer nip region.

According to the recording medium supply section 50, in synchronism with the conveyance of the toner image borne on the intermediate transfer belt 31 to the transfer nip region, the recording medium is fed to the transfer nip region from the paper feeding box 51 or the paper feeding tray 55, whereby the toner image can be transferred onto the recording medium.

In the laser fixing device 100, on receipt of the recording medium bearing the yet-to-be-fixed toner image that has just been conveyed thereto from the transfer nip region, light of predetermined intensity is applied to the yet-to-be-fixed toner image, so that the toner constituting the yet-to-be-fixed toner image can be fused and fixed to the recording medium. The recording medium bearing the fixed toner is then conveyed from the laser fixing device 100 to the discharge section 60. The laser fixing device 100 will hereafter be explained in detail.

The discharge section 60 includes conveying rollers 61, ejecting rollers 62, and a catch tray 63. The conveying rollers 61 are a pair of roller members arranged in pressure-contact with each other disposed vertically above the laser fixing device 100. The conveying rollers 61 convey the recording medium bearing the fixed toner image toward the ejecting rollers 62.

The ejecting rollers 62 are a pair of roller members arranged in pressure-contact with each other. In the case of single-sided printing operation, the ejecting rollers 62 effect ejection of the recording medium into the catch tray 63 following the completion of printing on one side of the recording medium. On the other hand, in the case of double-sided printing operation, the ejecting rollers 62 convey the recording medium which has undergone single-sided printing to the registration rollers 54 through a paper conveyance path A3, and, following the completion of printing on the other side of the recording medium, effect ejection of the recording medium into the catch tray 63. The catch tray 63 is placed on the top surface of the image forming apparatus 1000 in the vertical direction, for storing the recording medium bearing the fixed image.

The image forming apparatus 1000 further comprises the control unit section (not shown). The control unit section is provided in, for example, an upper part of an inner space of the image forming apparatus 1000 in a vertical direction thereof, and comprises a memory portion, a calculation portion and a control portion. In the memory portion, various set values mediated through an operation panel (not shown) provided at an upper part of the image forming apparatus 1000 in a vertical direction thereof, detection results from sensors (not shown) arranged at various positions in the image forming apparatus 1000, image information from external devices, and the like are inputted. Furthermore, programs performing various processing are written in the memory portion. The various processing are recording medium judgment processing, attachment amount control processing, fixing temperature control processing, and the like.

The memory portion can use memories conventionally used in this field, and examples thereof include a read-only memory (ROM), a random access memory (RAM) and a hard disk drive (HDD). The external device can use electronic devices capable of forming and acquiring image information and capable of electrically connecting to the image forming apparatus 1000, and examples thereof include a computer, a digital camera, a television receiver, a video recorder, a DVD (Digital Versatile Disc) recorder, an HDDVD (High-Definition Digital Versatile Disc) recorder, a Blu-ray disc recorder, a facsimile apparatus, and a portable terminal unit.

The calculation portion retrieves various data (image formation order, detection results, image information and the like) written in the memory portion and programs for various processing and carries out various judgments. The control portion sends a control signal to the apparatus according to judgment results of the calculation portion and carries out operation control.

The control portion and the calculation portion include a processing circuit realized by a microcomputer, a microprocessor and the like equipped with a central processing unit (CPU). The control unit section includes a main power source together with the above-described processing circuit, and the power source feeds electric power to not only the control unit section, but also each device in the inside of the image forming apparatus 1000.

Figure 3:
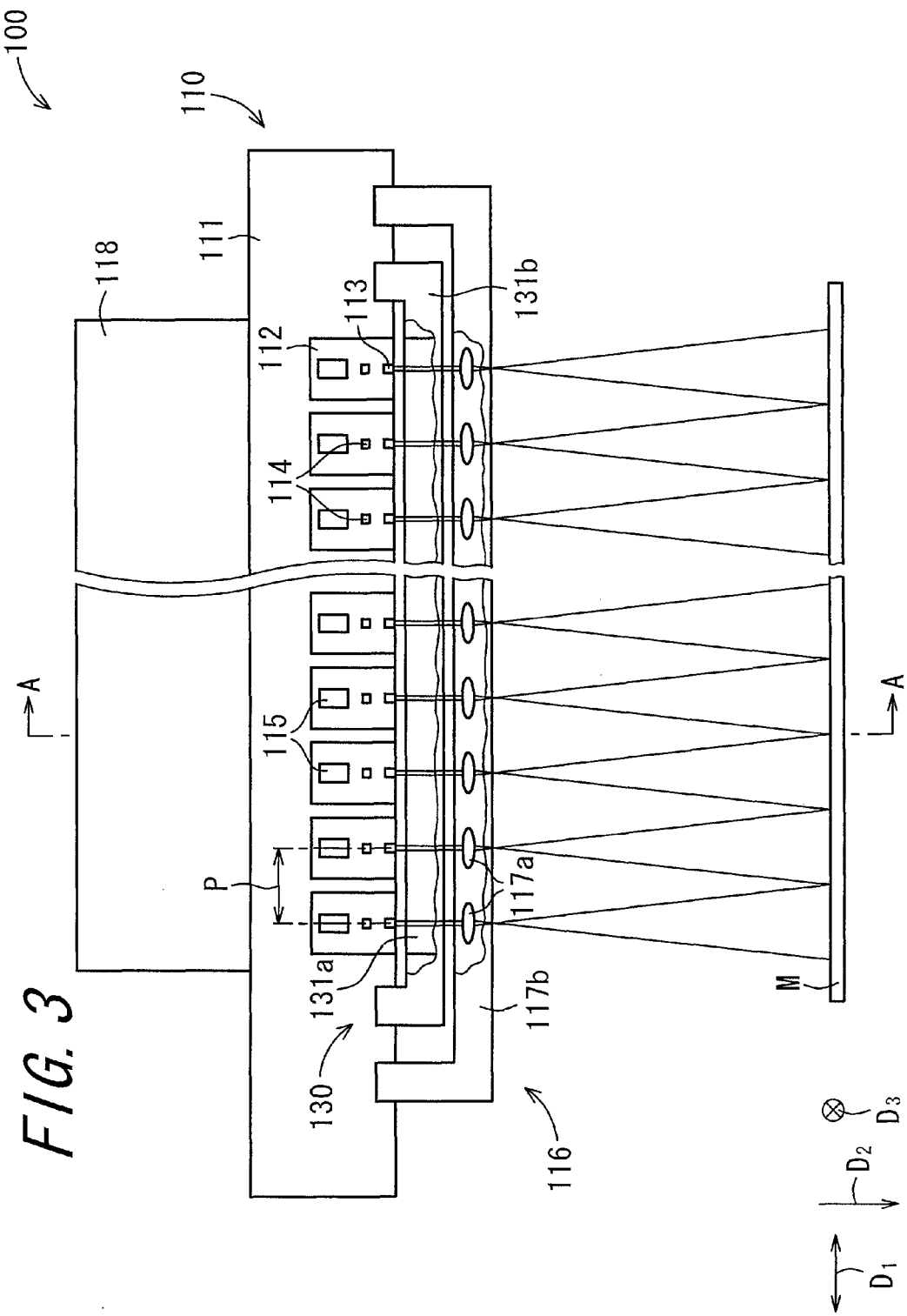
FIG. 3 is a partially cutaway schematic view of a laser fixing device.
Figure 4:
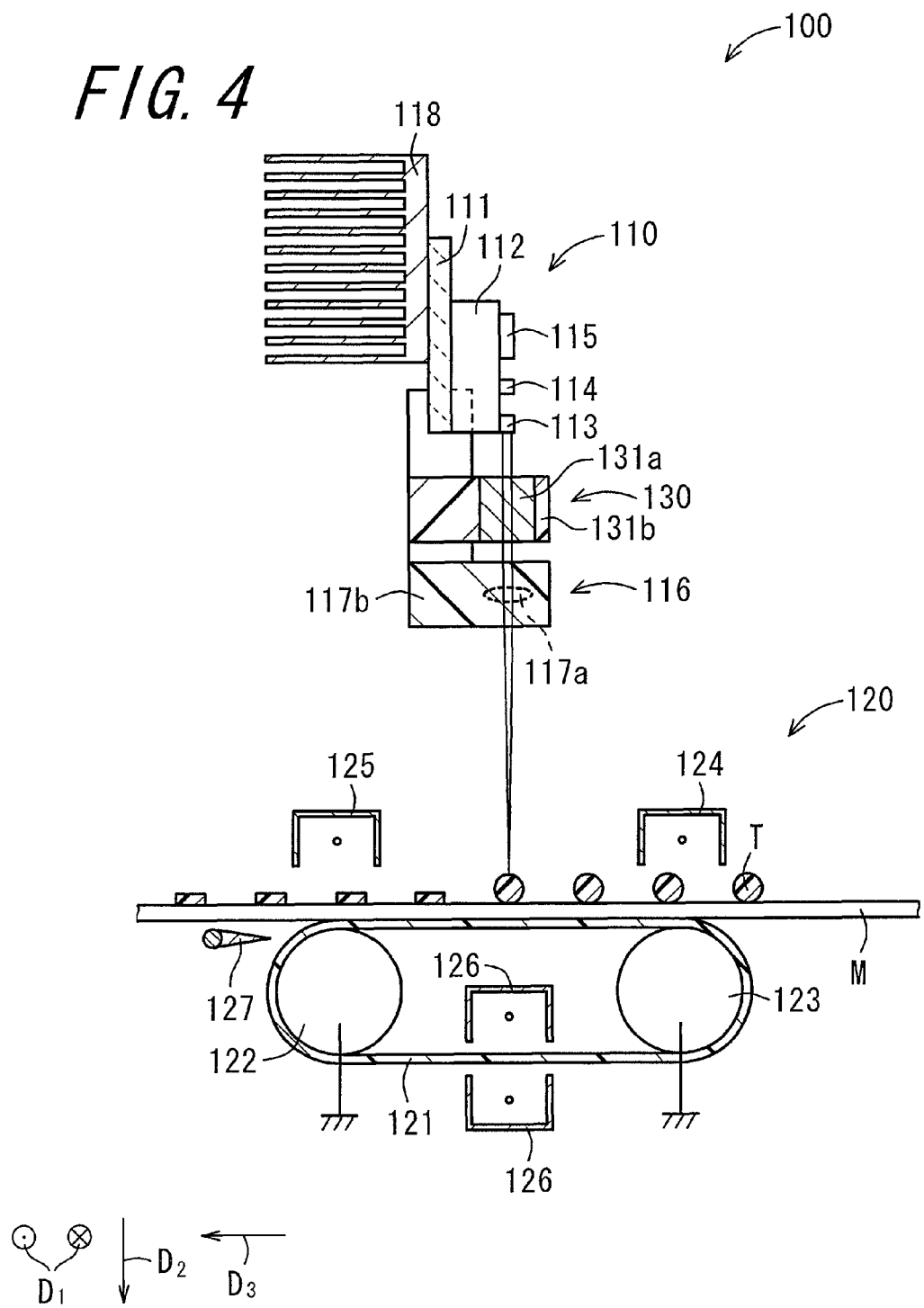
FIG. 4 is a sectional view of the laser fixing device taken along the line A-A of FIG. 3.

Next, the laser fixing device 100 will be described in detail. FIG. 3 is a partially cutaway schematic view of the laser fixing device 100. FIG. 4 is a sectional view of the laser fixing device 100 taken along the line A-A of FIG. 3. The laser fixing device 100 comprises a laser light emitting section 110, a conveying section 120, and a wavelength conversion section 130.

The laser light emitting section 110 is a device for emitting laser light. In this embodiment, the laser light emitting section 110 is a semiconductor laser element array constructed of a plurality of semiconductor laser elements 113 arranged side by side in an array. Laser light emitted from the semiconductor laser element 113 has a substantially perfect circle in cross section perpendicular to an emission direction in which the laser light travels. The semiconductor laser elements 113 are so arranged that laser light beams emitted therefrom, respectively, travel in the same direction and this emission direction is perpendicular to the direction of arrangement of the semiconductor laser elements 113. In the following description, the direction of arrangement of the semiconductor laser elements 113 will be referred to as "arrangement direction $D_1$", the direction of emission of laser light from the semiconductor laser element 113 will be referred to as "radiation direction $D_2$", and one of the directions that are perpendicular to both the arrangement direction $D_1$ and the radiation direction $D_2$ will be referred to as "scanning direction $D_3$".

In this embodiment, a semiconductor laser element which is 780 nm in wavelength of emitted laser light and 150 mW in rated power value is used as the semiconductor laser element 113. One thousand pieces of the semiconductor laser elements are arranged in an array, and an arrangement pitch P of the semiconductor laser elements 113 is set at 0.3 mm.

The semiconductor laser elements 113 are each placed on a silicon substrate 112 made of silicon. On the silicon substrate 112 are formed a control circuit (not shown) and a light-receiving element 114 in monolithic form. The light-receiving element 114 is a photodiode for monitoring. The control circuit acts, in response to a signal inputted from the light-receiving element 114, to control a voltage to be applied to the semiconductor laser element 113 for changing power of laser light as well as for rendering the laser-light power uniform. The control circuit and the semiconductor laser element 113 are electrically connected to each other through an electrode and a bonding wire, which are not shown.

Also formed on the silicon substrate 112 is a temperature sensor 115 such as a thermistor for measuring temperature of each of the semiconductor laser elements 113. On the basis of the data of temperature detected by the temperature sensor 115, the control circuit exercises control of a voltage to be applied to the semiconductor laser element 113.

The silicon substrate 112 is placed on a ceramic board 111, with its opposite surface to a surface bearing the semiconductor laser element 113 facing the top of the ceramic board. An electrode (not shown) on the ceramic board 111 and an electrode (not shown) on the silicon substrate 112 are electrically connected to each other by means of wire bonding or otherwise.

On the opposite surface of the ceramic board 111 to a surface bearing the silicon substrate 112, there is placed a heat sink 118. In this embodiment, the heat sink 118 is constructed of ten pieces of aluminum alloy-made heat sinks in total, each of which is 30 mm long, 30 mm wide, and 20 mm tall (base size) and exhibits thermal resistance of 1.6° C./W (Model UB30-20B manufactured by Alpha Company Ltd.), arranged in a line in the arrangement direction $D_1$. In this embodiment, the total thermal resistance of the heat sink 118 is 0.16° C./W.

A lens array 116 is located downstream of the semiconductor laser element 113 in the radiation direction $D_2$. The lens array 116 includes convex lenses 117a as many as the semiconductor laser elements 113 in total and a lens holder 117b for holding the convex lenses 117a. The lens array 116 is so configured that laser light beams emitted individually from the semiconductor laser elements 113 enter their respective convex lenses 117a. The convex lenses 117a are each so designed that light emitted therefrom assumes the shape of an elongated ellipse when shone on a recording medium M borne by the conveying section 120 which will hereafter be described. The major axis of the ellipse is 0.3 mm long along the arrangement direction $D_1$.

Exemplary of the lens array 116 are: an assembly of the convex lenses 117a set in the lens holder 117b; a single-piece structure of the convex lenses 117a and the lens holder 117b formed of a common resin; and a flat-plate micro lens array produced by forming lens portions in a flat plate glass by means of ion exchange. Among them, the single-piece structure and the flat-plate micro lens array are desirable from the standpoint of savings in manufacturing costs, a reduction in the number of manufacturing process steps, and high accuracy of manufacture. It is noted that the laser light emitting section 110 and the conveying section 120 may be arranged in proximity to each other, instead of providing the lens array 116.

The laser fixing device according to the invention includes a wavelength conversion section for emitting outgoing light having a wavelength different from the one that incident laser light has. In this embodiment, the wavelength conversion section 130 is detachably mounted between the semiconductor laser element 113 and the lens array 116. The wavelength conversion section 130 comprises a wavelength conversion element 131a and a retainer portion 131b. The retainer portion 131b is detachably mounted on the ceramic board 111 to retain the wavelength conversion element 131a firmly.

The wavelength conversion element 131a is a member, such as a second harmonic generation (SHG) element or a third harmonic generation element, from which outgoing light having a wavelength different from the wavelength of incident light is emitted. Such a harmonic generation element generates a harmonic of desired magnitude by birefringence phase matching (BPM) using a crystalline material having birefringence or quasi phase matching (QPM) using a periodically polarization-inverted structure.

In this embodiment, among SHG elements employing QPM, a SHG element of waveguide type is used as the wavelength conversion element 131a. In the SHG element, each waveguide is placed on a straight line connecting each of the semiconductor laser elements 113 with each of the convex lenses 117a. It is noted that a bulk-type SHG element may be used instead of the waveguide-type SHG element.

As described above, the semiconductor laser element 113 emits laser light having a wavelength of 780 nm. Therefore, upon incidence of the laser light on the SHG element, light having a wavelength of 390 nm is emitted from the SHG element and the outgoing light travels toward the convex lens 117a. That is, in this embodiment, an infrared ray emitted from the semiconductor laser element 113 enters the SHG element, and then an ultraviolet ray is emitted from the SHG element. As employed herein, a wavelength region in a range of 400 nm or more and 760 nm or less is a visible region, a wavelength region of less than 400 nm is an ultraviolet region, and a wavelength region of greater than 760 nm is an infrared region. Moreover, light having a wavelength within the visible region is a visible light beam, light having a wavelength within the ultraviolet region is an ultraviolet ray, and light having a wavelength within the infrared region is an infrared ray.

In this embodiment, the wavelength conversion section 130 is detachably mounted. In the construction with the wavelength conversion section 130 removed, an infrared ray emitted from the semiconductor laser element 113 is directly incident on the convex lens 117a, is condensed by the convex lens 117a, and is shone on a toner T on the recording medium M. On the other hand, in the construction equipped with the wavelength conversion section 130, after an infrared ray emitted from the semiconductor laser element 113 enters the wavelength conversion element 131a (SHG element), an ultraviolet ray is emitted from the SHG element, and this ultraviolet ray enters the convex lens 117a, is condensed by the convex lens 117a, and is then shone on the toner T on the recording medium M. Accordingly, in this embodiment, in the case of using an infrared-fixable toner as the light fixable toner, the wavelength conversion section 130 is removed, so that the infrared-fixable toner can be fused and fixed. On the other hand, in the case of using an ultraviolet-fixable toner as the light fixable toner, the wavelength conversion section 130 is set in position, so that the ultraviolet-fixable toner can be fused and fixed.

It is noted that, by way of another embodiment, when the wavelength of laser light emitted from the semiconductor laser element 113 is set to 800 nm, then outgoing light from the SHG element has a wavelength of 400 nm. Therefore, in this embodiment, two types of light, namely an infrared ray and a visible light beam, can be applied to the toner, which leads to adaptability to use of both an infrared-fixable toner and an visible light-fixable toner.

The conveying section 120 comprises a conveying belt 121, a driving roller 122, a driven roller 123, an attraction charger 124, a separation charger 125, a charge-removing charger 126, and a peeling pawl 127. The conveying section 120 is situated at a position spaced downstream away from the lens array 116 by a distance of 50 mm in the radiation direction $D_2$. It is desirable to change the distance between the conveying section 120 and the lens array 116 in accordance with the convex lens 117a for use.

The conveying belt 121 is an endless belt-shaped member which is supported around the driving roller 122 and the driven roller 123 with tension, and forms a loop-like traveling path. The conveying belt 121 moves the recording medium M borne on it in the scanning direction $D_3$. On the conveying belt 121, the recording medium M is irradiated with light, whereby the yet-to-be-fixed toner is fused and fixed. In this embodiment, the conveying belt 121 is 75 μm in thickness and $10^{16}$ Ω·cm in volume resistivity.

In this embodiment, it is preferable that the conveying belt 121 is made of a material having an infrared transmittance of greater than or equal to 70% and an ultraviolet transmittance of greater than or equal to 80%. When made of such a material, the conveying belt 121 becomes resistant to light-induced quality degradation and can thus be used for a longer period of time. Exemplary of such a material are transparent polyolefin, polyamide, and Teflon (registered trade mark).

The driving roller 122 is so disposed as to be rotatable about its axis by a driving portion (not shown). The driving roller 122 causes the conveying belt 121 to be turned to run by rotation thereof. The driving roller 122 is made of an electrically conductive material and is connected to ground.

The driven roller 123 is located upstream of the driving roller 122 in the scanning direction $D_3$ and so as to be rotatable in accordance with rotation of the driving roller 122, and generates a constant tension in the conveying belt 121 so that the conveying belt 121 does not go slack. The driven roller 123 is made of an electrically conductive material and is connected to ground.

The attraction charger 124 is a corona discharge device placed at a position facing the driven roller 123. The recording medium M bearing a yet-to-be-fixed toner image is conveyed to a region between the conveying belt 121 running above the driven roller 123 and the attraction charger 124. The attraction charger 124 causes dielectric polarization in each of the recording medium M and the conveying belt 121 by effecting corona discharge. In this way, the recording medium M is electrostatically attracted onto the conveying belt 121.

The separation charger 125 is a corona discharge device placed at a position facing the driving roller 122. The recording medium M bearing fixed toner is conveyed to a region between the conveying belt 121 running above the driving roller 122 and the separation charger 125. The separation charger 125 removes the charge on the recording medium M by effecting corona discharge at a polarity reverse to the polarity set for the attraction charger 124. In this way, the electrostatic attraction of the recording medium M to the conveying belt 121 is decreased.

The peeling pawl 127 is located downstream of the driving roller 122 in the scanning direction $D_3$, and peels the recording medium M off the conveying belt 121. The charge-removing charger 126 is a corona discharge device for removing the charge on the conveying belt 121 by effecting corona discharge at a polarity reverse to the polarity set for the attraction charger 124 on the conveying belt 121 with the recording medium M peeled.

It is noted that, in the laser fixing device 100, power adjustment and pulse width adjustment are conducted in a manner that, when yet-to-be-fixed toner borne on the recording medium M is irradiated with light, allows the toner to be melted thoroughly, and prevents occurrence of a decomposition phenomenon (called abrasion) in which intermolecular bonds in a binder resin constituting the toner are broken immediately. The power adjustment and pulse width adjustment are preferably conducted for each of the case of laser light irradiation and the case of outgoing-light irradiation on an individual basis.

Next, a laser fixing device 200 implemented by way of a second embodiment of the invention will be described. FIGS. 5A and 5B are schematic views showing the laser fixing device 200. The laser fixing device 200 comprises a laser light emitting section 110, a conveying section 120, and a wavelength conversion section 230. The description of the laser light emitting section 110 and the conveying section 120 will be omitted.

The wavelength conversion section 230 includes a wavelength conversion element 131a, a movable portion 231a, and a stationary portion 231b. The description of the wavelength conversion element 131a will be omitted. The stationary portion 231b is secured to the ceramic board 111 to support the movable portion 231a.

The movable portion 231a fixedly holds the wavelength conversion element 131a. The movable portion 231a is connected to a driving portion (not shown). By operating the driving portion under the control of a control unit section, the movable portion 231a can be moved in both the scanning direction $D_3$ and a direction opposite to the scanning direction $D_3$. FIG. 5A shows a state where the movable portion 231a has moved in the direction opposite to the scanning direction $D_3$. FIG. 5B shows a state where the movable portion 231a has moved in the scanning direction $D_3$.

As shown in FIG. 5A, the movable portion 231a is so designed that laser light emitted from the semiconductor laser element 113 is incident on the wavelength conversion element 131a in a state where the movable portion 231a has moved in the direction opposite to the scanning direction $D_3$. Therefore, when the movable portion 231a has moved in the direction opposite to the scanning direction $D_3$, the toner borne on the recording medium M is irradiated with outgoing light from the wavelength conversion element 131a. Hereinafter, the state where the movable portion 231a has moved in the direction opposite to the scanning direction $D_3$ will be referred to as "outgoing light applied state".

Moreover, as shown in FIG. 5B, the movable portion 231a is so designed that laser light emitted from the semiconductor laser element 113 is not incident on the wavelength conversion element 131a but is incident on the convex lens 117a in a state where the movable portion 231a has moved in the scanning direction $D_3$. Therefore, when the movable portion 231a has moved in the scanning direction $D_3$, the toner borne on the recording medium M is irradiated with laser light from the semiconductor laser element 113. Hereinafter, the state where the movable portion 231a has moved in the scanning direction $D_3$ will be referred to as "laser light applied state".

Thus, in this embodiment, the wavelength conversion section 230 is configured for free selection between the laser light applied state and the outgoing light applied state by an automatic mechanism, instead of detachable mount. Accordingly, adaptability to use of two types of light fixable toners having different light absorption characteristics can be attained without the necessity for attachment and detachment of the wavelength conversion section 230.

Now, toner which is employed in the invention will be described hereinbelow. The toner according to the invention is a light fixable toner which is fused and fixed through absorption of irradiated light. The toner according to the invention contains at least a binder resin and a colorant.

There is no particular limitation to the binder resin so long as it is customarily used as a binder resin for electrophotographic toner. Examples of the binder resin include polyester, polyurethane, epoxy resin, acrylic resin, and styrene-acrylic resin. Among them, polyester, acrylic resin, and styrene-acrylic resin are desirable for use. The binder resin materials may be used each alone, or two or more of them may be used in combination. It is also possible to use a plurality of resin materials that are of the same kind but differ from each other in any one or two or more of molecular weight, monomer composition, and so forth.

Polyester is excellent in transparency, and its use makes it possible to impart satisfactory powder flowability, fixability at low temperature, secondary color reproducibility, and so forth to toner particles and is therefore suitable for a binder resin used for toner application purposes. A heretofore known polyester substance may be used, which is obtainable by a polycondensation reaction between a polybasic acid and a polyalcohol, for example.

As the polybasic acid, any of those heretofore known as monomer of polyester may be used. The examples thereof include: aromatic carboxylic acids such as a terephthalic acid, an isophthalic acid, a phthalic acid anhydride, a trimellitic acid anhydride, a pyromellitic acid, or a naphthalene dicarboxylic acid; aliphatic carboxylic acids such as a maleic acid anhydride, a fumaric acid, a succinic acid, an alkenyl succinic anhydride, or an adipic acid; and methyl esterified compounds of those polybasic acids. The polybasic acids may be used each alone, or two or more of them may be used in combination.

As the polyalcohol, any of those heretofore known as monomer of polyester may be used. The examples thereof include: aliphatic polyalcohols such as ethylene glycol, propylene glycol, butane diol, hexane diol, neopentyl glycol, or glycerin; alicyclic polyalcohols such as cyclohexane diol, cyclohexane dimethanol, or hydrogenated bisphenol A; and aromatic diols such as an ethylene oxide adduct of bisphenol A or a propylene oxide adduct of bisphenol A. The polyalcohols may be used each alone, or two or more of them may be used in combination.

A polycondensation reaction between a polybasic acid and a polyalcohol can be induced by a heretofore known method. For example, a polybasic acid and a polyalcohol are exposed to each other in the presence or absence of an organic solvent and in the presence of a polycondensation catalyst. The reaction is terminated upon the acid value, the softening point, and so forth of the resultant polyester reaching predetermined values. In this way, desired polyester can be obtained. Polyester can also be obtained through a de-methanol polycondensation reaction using a polyalcohol and, instead of a polybasic acid, a methyl-esterified compound of a polybasic acid.

In the polycondensation reaction, by making changes to the blending ratio between the polybasic acid and the polyalcohol, the reaction rate, and so forth in an appropriate manner, for example, it is possible to adjust the content of carboxylic groups at polyester terminus and thus obtain modified polyester. Moreover, by using a trimellitic acid anhydride as a polybasic acid, it is possible to introduce a carboxyl group d easily into the main chain of polyester and thus obtain modified polyester. Further, by connecting a hydrophilic group such as a carboxyl group or a sulfonic acid group to at least one of the main chain and the side chain of polyester, polyester which is self-dispersible in water can be obtained. Polyester may be coupled to acrylic resin by means of grafting.

Examples of styrene-acrylic resin include a styrene-methyl acrylate copolymer; a styrene-ethyl acrylate copolymer; a styrene-butyl acrylate copolymer; a styrene-methyl methacrylate copolymer; a styrene-ethyl methacrylate copolymer; a styrene-butyl methacrylate copolymer; and a styrene-acrylonitrile copolymer.

As the colorant, for example, organic dyes, organic pigments, inorganic dyes, and inorganic pigments that have been customarily used in the field of electrophotographic toner may be used.

Examples of a black colorant include carbon black, copper oxide, manganese dioxide, aniline black, activated carbon, non-magnetic ferrite, magnetic ferrite, and magnetite.

Examples of a yellow colorant include chrome yellow, zinc yellow, cadmium yellow, yellow iron oxide, mineral fast yellow, nickel titanium yellow, navel yellow, naphtol yellow S, hanza yellow G, hanza yellow 10G, benzidine yellow G, benzidine yellow GR, quinoline yellow lake, permanent yellow NCG, tartrazine lake, C.I. Pigment Yellow 12, C.I. Pigment Yellow 13, C.I. Pigment Yellow 14, C.I. Pigment Yellow 15, C.I. Pigment Yellow 17, C.I. Pigment Yellow 93, C.I. Pigment Yellow 94, and C.I. Pigment Yellow 138.

Examples of an orange colorant include red chrome yellow, molybdenum orange, permanent orange GTR, pyrazolone orange, vulcan orange, indanthrene brilliant orange RK, benzidine orange G, indanthrene brilliant orange GK, C.I. Pigment Orange 31, and C.I. Pigment Orange 43.

Examples of a red colorant include red iron oxide, cadmium red, red lead, mercury sulfide, cadmium, permanent red 4R, lysol red, pyrazolone red, watching red, calcium salt, lake red C, lake red D, brilliant carmine 6B, eosin lake, rhodamine lake B, alizarin lake, brilliant carmine 3B, C.I. Pigment Red 2, C.I. Pigment Red 3, C.I. Pigment Red 5, C.I. Pigment Red 6, C.I. Pigment Red 7, C.I. Pigment Red 15, C.I. Pigment Red 16, C.I. Pigment Red 48:1, C.I. Pigment Red 53:1, C.I. Pigment Red 57:1, C.I. Pigment Red 122, C.I. Pigment Red 123, C.I. Pigment Red 139, C.I. Pigment Red 144, C.I. Pigment Red 149, C.I. Pigment Red 166, C.I. Pigment Red 177, C.I. Pigment Red 178, and C.I. Pigment Red 222.

Examples of a violet pigment include manganese violet, fast violet B and methyl violet lake.

Examples of a blue colorant include Prussian blue, cobalt blue, alkali blue lake, Victoria blue lake, phthalocyanine blue, metal-free phthalocyanine blue, phthalocyanine blue-partial chlorination product, fast sky blue, indanthrene blue BC, C.I. Pigment Blue 15, C.I. Pigment Blue 15:2, C.I. Pigment Blue 15:3, C.I. Pigment Blue 16, and C.I. Pigment Blue 60.

Examples of a green pigment include chrome green, chrome oxide, Pigment Green B, malachite green lake, final yellow green G, and Pigment Green 7.

Examples of a white colorant include various compounds such as zinc oxide, titanium oxide, antimony white, and zinc sulfide.

The colorants may be used each alone, or two or more of the colorants of different colors may be used in combination. It is also possible to use two or more kinds of colorants of identical color family in combination. Although the usage of the colorant is not particularly restricted, preferably it falls in a range of from 0.1 part to 20 parts by weight, and more preferably from 0.2 part to 10 parts by weight, based on 100 parts by weight of the binder resin.

As described above, the toner employed in the invention is a light fixable toner. The light fixable toner contains a light absorbing material which absorbs light with consequent fusing of a binder resin. In the toner of black color, since the colorant contained therein acts as the light absorbing material, there is no need for addition of the light absorbing material as a material other than the binder resin and colorant. By contrast, color toners other than the black toner cannot be fused and fixed readily only with the light absorbing capability of the colorant contained therein, and therefore necessitate addition of the light absorbing material as a material other than the binder resin and colorant.

The light absorbing material to be added to the toner varies depending on the wavelength of light which is applied by the laser fixing device according to the invention. As described previously, the laser fixing device according to the invention is capable of applying two types of light having different wavelengths to toner. The light absorbing material has to be a material having a maximum absorption peak wavelength approaching at least one of the wavelengths of the two types of light. For example, given that the wavelength of laser light is $\lambda_1$ [nm] and the wavelength of outgoing light is $\lambda_2$ [nm], then the light absorbing material has a maximum absorption peak wavelength within at least one of the wavelength range of $\lambda_1 \pm 20$ [nm] and the wavelength range of $\lambda_2 \pm 30$ [nm].

The laser fixing device 100, 200 is designed to emit an infrared ray as laser light and emit an ultraviolet ray as outgoing light. Accordingly, color toner used in the image forming apparatus 1000 equipped with the laser fixing device 100, 200 contains, as the light absorbing material, at least one of an infrared absorbing material having a maximum absorption peak wavelength within the infrared region or an ultraviolet absorbing material having a maximum absorption peak wavelength within the ultraviolet region.

Exemplary of the infrared absorbing material are those having a maximum absorption peak wavelength within the wavelength region ranging from 750 nm to 850 nm including a cyanine-based material, a phthalocyanine-based material, a naphthalocyanine-based material, a dithio-nickel complex-based material, a naphthoquinone-based material, an anthraquinone-based material, an indophenol-based material, and an azo-based material.

For example, the additive amount of the infrared absorbing material falls in a range of 0.1 part by weight or more and 5.0 parts by weight or less based on 100 parts by weight of the binder resin of color toner. If the additive amount is less than 0.1 part by weight, the light absorption efficiency becomes so low that the fixability will be impaired. Moreover, if the additive amount is greater than 5.0 parts by weight, the light absorption efficiency becomes so high that abrasion occurs abruptly with consequent degradation of image quality.

Exemplary of the ultraviolet absorbing material is one or two or more of those selected from among polyimide (PI), polyethylene sulfide (PES), polyethylene naphthalate (PEN), and polymethyl methacrylate (PMMA). Those resins have a maximum absorption peak wavelength within the near-ultraviolet region (the wavelength region ranging from 300 nm to 400 nm) and thus exhibit relatively high light transmittance in the visible region. Accordingly, where at least one of laser light and outgoing light from the laser fixing device 100, 200 is a near-ultraviolet ray, the use of such a resin makes it possible to obtain an image which exhibits high fixation strength and high color reproducibility.

Figure 6:
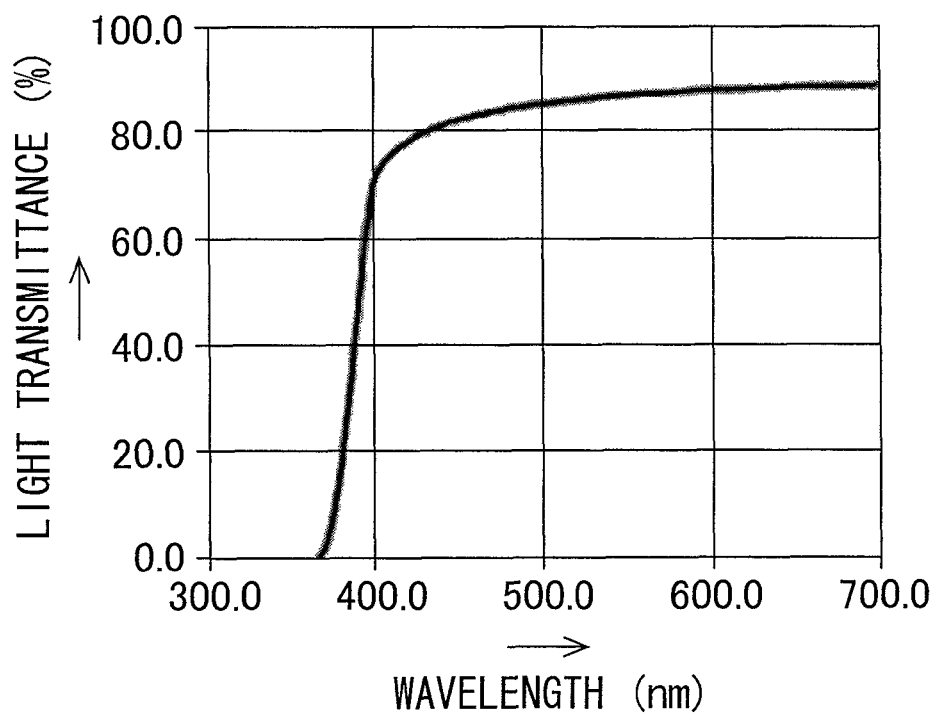
FIG. 6 is a view showing the light transmittance of polyimide.

In FIG. 6, there is shown the light transmittance of polyimide. FIG. 6 indicates the relationship between the wavelength (nm) of light which is applied to polyimide and the light transmittance (%) of polyimide. As shown in FIG. 6, polyimide has a maximum absorption peak wavelength within the near-ultraviolet region and thus exhibits relatively high light transmittance in the visible region.

A resin material having an ultraviolet absorbing group may be used as the ultraviolet absorbing material. Exemplary of the resin material having an ultraviolet absorbing group is an acrylic resin having a conformation obtained by copolymerization between a compound formed by introducing a methacroyl group, which is an ultraviolet absorbing group, into a benzotriazole skeleton and methacrylate (MMA). Such a resin material has a high compatibility with the binder resin of toner and thus contributes to suppression of bleeding out of the ultraviolet absorbing material. Moreover, the resin material exhibits relatively high light transmittance in the visible region.

For example, the additive amount of the ultraviolet absorbing material falls in a range of 0.05 part by weight or more and 5.0 parts by weight or less based on 100 parts by weight of the binder resin of color toner. If the additive amount is less than 0.05 part by weight, the light absorption efficiency becomes so low that the fixability will be impaired. Moreover, if the additive amount is greater than 5.0 parts by weight, the light absorption efficiency becomes so high that abrasion occurs abruptly with consequent degradation of image quality. Furthermore, if the additive amount is greater than 5.0 parts by weight, the toner flowability will be impaired.

The toner according to the invention may contains a wax. In general, a toner which is employed in an image forming apparatus equipped with a heat-roller type fixing device is added with a wax as a release agent. On the other hand, in forming a light fixable toner for use in an image forming apparatus equipped with an optical fixing device, there is no need to pay regard to parting property. However, wax, especially an amide-based wax having an amide group exhibits high wettability to a colorant and provides the effect of adsorbing a colorant and facilitating dispersing it in a binder resin, and is therefore preferably added to the light fixable toner. Since the amide-based wax provides not only the effect of dispersing a colorant but also the effect of enhancing wettability to a recording medium during fixing process, its use allows enhancement in fixability.

In order to prevent occurrence of blocking during toner storage, a wax having a melting point in a range of 50° C. to 160° C., more preferably a wax having a melting point in a range of 60° C. to 120° C., is used. If the melting point of the wax is lower than 50° C., blocking is likely to occur. Moreover, if the melting point exceeds 160° C., the toner cannot be melted readily with consequent lowering of fixability. Although the additive amount of the wax is not particularly restricted and can be appropriately selected in a wide range, it should preferably fall in a range of from 0.2 part to 20 parts by weight, and more preferably from 0.5 part to 10 parts by weight, based on 100 parts by weight of the binder resin. If the additive amount of the wax is less than 0.2 part by weight, sufficient dispersibility and wettability cannot be attained. Moreover, if the additive amount exceeds 20 parts by weight, blocking is likely to occur during toner storage.

The toner according to the invention may contain a charge control agent. As the charge control agent, charge control agents for positive charge control or negative charge control that have been customarily used in the field of electrophotographic toner may be used. Examples of the charge control agent for positive charge control include a basic dye, a quaternary ammonium salt, a quaternary phosphonium salt, aminopyrine, a pyrimidine compound, a multinuclear polyamino compound, aminosilane, a nigrosine dye and derivatives thereof, a triphenylmethane derivative, a guanidine salt, and an amidine salt. Examples of the charge control agent for negative charge control include an oil-soluble dye such as oil black and spiron black, a metallized azo compound, an azo complex dye, a naphthene acid metallic salt, metallic complex and metallic salt of salicylic acid and derivatives thereof (metal: chrome, zinc, zirconium, and so forth), a fatty acid soap, a long-chain alkylcarboxylic acid salt, and a resin acid soap. The charge control agents may be used each alone, or two or more of them may be used in combination. The usage of the charge control agent is not particularly restricted and can be appropriately selected in a wide range.

The toner according to the invention may a surface control agent. The surface control agent has a composition including a compatible part which is highly compatible with the binder resin constituting the toner and an incompatible part which is poorly compatible with the binder resin. As the toner is caused to fused, the surface control agent becomes oriented on toner surface with consequent lowering of the surface tension of the toner. As a result, the toner has enhanced wettability to a recording medium and is therefore readily spread over the surface and interior of the recording medium. This leads to enhancement in fixability.

As the surface control agent, a fluorine-based leveling agent, a silicone-based leveling agent, an ether polymeric leveling agent, a nonionic leveling agent containing a fluorine compound, and the like may be used. The additive amount of the surface control agent preferably falls in a range of from 0.05 part to 5.0 parts by weight, and more preferably from 0.1 part to 3.0 parts by weight, based on 100 parts by weight of the binder resin. If the additive amount is less than 0.05 part by weight, it becomes difficult to attain the effect of reducing surface tension. Moreover, if the additive amount exceeds 5.0 parts by weight, blocking is likely to occur during toner storage.

An external additive may be externally added to the toner according to the invention for powder fluidity enhancement, frictional chargeability enhancement, heat resistance enhancement, preservation stability enhancement, cleaning characteristic improvement, photoreceptor-surface abrasion property control, and other purposes. As the external additive, any of heretofore known ones may be used, for example, fine silica powder, fine titanium oxide powder, and fine alumina powder. The external additive is preferably subjected to surface treatment using silicone resin, a silane coupling agent, and the like. The external additives may be used each alone, or two or more of them may be used in combination. With consideration given to the charging characteristics and environmental characteristics of the toner, influence on photoreceptor abrasion, and so forth, the additive amount of the external additive preferably falls in a range of from 0.1 part to 10 parts by weight based on 100 parts by weight of the toner.

Examples of toner production methods include a dry method such as a crushing method and a wet method such as a suspension polymerization method, an emulsification aggregation method, a dispersion polymerization method, a dissolution suspension method, or a melting emulsification method. The following description deals with the crushing method.

According to the crushing method, a toner composition containing the binder resin, the colorant, and other components to be added to toner is dry-mixed by a mixer, and the admixture is melted and kneaded by a kneading machine. The kneaded product obtained through the melt-kneading process is cooled down for solidification, and the cool-solidified product is crushed by a pulverizer. After that, the resultant powdered product is subjected to granularity adjustment process such as classification, and is then externally added with an external additive on an as needed basis. In this way, the toner can be obtained.

As the mixer used for the dry-mixing process, any of heretofore known ones may be used, for example, Henschel type mixing apparatuses such as HENSCHEL MIXER (product name) manufactured by Mitsui Mining Co., Ltd., SUPER-MIXER (product name) manufactured by Kawata MFG Co., Ltd., and MECHANOMILL (product name) manufactured by Okada Seiko Co., Ltd., as well as ANGMILL (product name) manufactured by Hosokawa Micron Corporation, HYBRIDIZATION SYSTEM (product name) manufactured by Nara Machinery Co., Ltd., and COSMOSYSTEM (product name) manufactured by Kawasaki Heavy Industries, Ltd.

As the kneading machine used for the melt-kneading process, also, any of heretofore known ones may be used, for example, typical kneaders such as a twin-screw extruder, a three-roll mill, and a laboplast mill. Specific examples thereof include single- or twin-screw extruders such as TEM 100B (product name) manufactured by Toshiba Machine Co., Ltd. and PCM-65/87, PCM-30 (product names) manufactured by Ikegai Co., Ltd., and kneaders of open roll type such as KNEADEX (product name) manufactured by Mitsui Mining Co., Ltd.

The colorant may be used as a masterbatch to be dispersed uniformly in the binder resin, it is possible to use. Moreover, a toner additive component other than the binder resin and the colorant may be used as composite particles containing two or more toner additive components to be dispersed uniformly in the binder resin. For example, the composite particles are obtained by adding adequate amount of water, lower alcohol, or the like to two or more toner additive components, granulating the resultant admixture by a typical granulator such as a high-speed mill, and drying the resultant grains. The masterbatch and the composite particles are mixed with the binder resin in the dry-mixing process. Moreover, the light absorbing material may be mixed with the binder resin after being mixed with the wax by a mixer such as a kneader in advance. In this way, the light absorbing material can be dispersed evenly in the binder resin in the melt-kneading process.

The toner thereby produced may be used either as a one-component developer or a two-component developer. When used as a one-component developer, the toner is used alone without having to use a carrier. When used as a two-component developer, the toner is used in conjunction with a carrier.

It is noted that the toner according to the invention is not limited to the toner obtained by the crushing method thus far described, but may be of, for example, a toner having a core-shell structure. In the case of adopting the toner having a core-shell structure, a leveling agent is preferably added to at least one of the core part and the shell part of the toner.

FIG. 7 is a flowchart for explaining an image forming method according to the invention. In the invention, image formation is carried out by using the image forming apparatus 1000 equipped with the laser fixing device 100, 200 and the toner. More specifically, an image is formed through: a development step S1 of forming a light fixable toner image composed of the toner on the photoreceptor drum 21 by the developing device 24; a transfer step S2 of transferring the light fixable toner image formed in the development step S1 onto a recording medium by the transfer section 30; and a fixing step S3 of fusing and fixing the light fixable toner constituting the light fixable toner image on the recording medium by applying at least one of the laser light and the outgoing light to the light fixable toner image borne on the recording medium by means of the laser fixing device 100, 200.

In the case of forming an image by putting a light fixable toner of black color and a light fixable toner of another color on top of each other, in the transfer step S2, transfer is preferably so performed that the light fixable toner of another color is overlaid upstream of the light fixable toner of black color in the radiation direction $D_2$. For example, in the image forming apparatus 1000, toner images of different colors are overlaid one after another onto the intermediate transfer belt 31 so that a black toner image is put last. By doing so, when the toner images are transferred onto the recording medium by the transfer roller 36, the black toner image becomes the lowermost layer on the recording medium. This allows a color toner to be overlaid upstream of the black toner in the radiation direction $D_2$. In this way, by putting a color toner having a relatively low light absorption efficiency on the upstream side, the color toner can be irradiated with light of relatively high intensity and thereby fixed sufficiently. It is noted that the black toner has a relatively high light absorption efficiency. Therefore, even if light applied thereto is relatively low in intensity, the black toner can be fixed sufficiently.

In the transfer step S2, instead of performing transfer in such a way that the black toner becomes the lowermost layer on the recording medium, it is possible to check which toner is the highest in applied light absorption efficiency in advance and then performs transfer in such a way that the predetermined toner becomes the lowermost layer on the recording medium. This is because, for example, when comparison is made between black toner free from infrared absorbing material and color toner containing a large amount of infrared absorbing material, there may be a case where the color toner is higher in infrared absorption efficiency than the black toner. In this case, transfer is preferably so performed that this color toner becomes the lowermost layer on the recording medium.

The image forming method for the image forming apparatus 1000 may involve, prior to the development step S1, a checking step of checking the light absorption characteristics of toners of different colors. It is possible to conduct the checking step, for example, by providing a light-emitting section and a light-receiving section in the image forming apparatus 1000 interiorly thereof. More specifically, prior to the development step S1 is started (for example, immediately after replacement of toner cartridge or upon power-up of the image forming apparatus 1000), toner patches of toners of different colors are formed on the intermediate transfer belt 31. Then, predetermined light is applied to the toner patches by the light-emitting section. The light-receiving section receives the light that has been reflected from or transmitted through the toner patches. On the basis of the result of detection from the light-receiving section, the control unit section calculates the light absorption characteristics of the toners of different colors.

In this way, by operating the image forming apparatus 1000 in a manner to conduct the checking step of checking the light absorption characteristics of toners of different colors, without the necessity for users to check the light absorption efficiency of each of the toners of different colors and make necessary settings on their own, the control of the transfer step S2 in accordance with the light absorption characteristics of the toners as described above can be exercised by the control unit section.

Moreover, the image forming apparatus 1000 may be so designed that, when the presence of a color toner which differs greatly from others in light absorption characteristic is recognized in the checking step, a warning is issued to users. It is highly likely that color toners that differ greatly from each other in light absorption characteristic, for example, two types of color toners whose maximum absorption peak wavelengths differ 200 nm or further from each other, are distinct light fixable toners of different types (for example, an infrared-fixable toner and an ultraviolet-fixable toner). When such two different color toners are borne on a recoding medium, one of the color toners cannot be fused readily under application of laser light or outgoing light. Hence, the image forming apparatus 1000 is preferably designed to sound an alarm or give a message to inform users that the toner is in need of replacement.

When provided with the laser fixing device 200, the image forming apparatus 1000 may be designed to emit both laser light and outgoing light in the fixing step S3, instead of giving a warning as described above or in addition to giving a warning. For example, given that a black toner, a cyan toner, and an yellow toner are each an ultraviolet-fixable toner and only a magenta toner is an infrared-fixable toner. In this case, the magenta toner cannot be fused and fixed thoroughly only with application of outgoing light (ultraviolet ray) from the wavelength conversion element 131*a*. However, following the application of outgoing light to the recording medium, by applying laser light thereto, the magenta toner can be fused. As has already been described, the laser fixing device 200 is so designed that selection between the outgoing light applied state and the laser light applied state can be made by the control unit section. Therefore, when light fixable toners of different types are recognized in the checking step, by controlling the image forming apparatus 1000 in such a manner that light-application state switching takes place to enable application of both laser light and outgoing light, it is possible to perform image formation without the necessity of toner replacement.

It is noted that application of both laser light and outgoing light as described above can be effected after adding light absorbing materials corresponding to laser light and outgoing light, respectively, to the toner. For example, a light fixable toner that contains both an infrared absorbing material and an ultraviolet absorbing material can be fixed firmly by application of both laser light and outgoing light. Moreover, in such a toner, the content of each of the infrared absorbing material and the ultraviolet absorbing material is lower than would be the case where any one of the materials is contained singly, and enhancement in color reproducibility can be achieved.

EXAMPLES

While practical examples of the invention will be described below, the invention is not so limited. In the following description, the term "part (parts)" means "part (parts) by weight" and the symbol "%" means "% by weight".

(1) Evaluation Method

Evaluations on glossiness, image density, and fixability have been conducted in the following manner. Note that image samples were obtained as follows. On a paper sheet for full-color printing (PP 106A4C) manufactured by SHARP CORPORATION, an image is formed in an unfixed state while adjusting the toner attachment amount to a predetermined level by using a copying machine (type MX-5001 FN) manufactured by SHARP CORPORATION. Then, the image is fixed by a fixing device as will hereafter be described.

(Glossiness Evaluation)

With use of GlossMeter GM-26D (manufactured by Murakami Color Research Laboratory), gloss value measurement has been conducted on the image samples under a condition where the angle of incidence is 75 degrees. The larger is the gloss value, the higher is the surface smoothness. In this evaluation, a gloss value of grater than or equal to 50 was rated as "Good", whereas a gloss value of less than 50 was rated as "Poor".

(Image Density Evaluation)

With use of Colorimeter X-rite 938 (manufactured by X-Rite Corporation), density (image density ID) measurement has been conducted on the image samples under a condition where the toner attachment amount on the full-color printing sheet is 1.0 mg/cm$^2$. In this evaluation, an image density ID of grater than or equal to 1.6 was rated as "Good", whereas an image density ID of less than 1.6 was rated as "Poor".

(Fixability Evaluation)

Fixability evaluation has been conducted as follows. A solid image in a fixed state is folded by using a weight under a load of 1 kg, and an unprinted full-color printing sheet with the weight placed on it is dragged on the folded image with consequent peeling of toner at the fold of the toner image. Fixability has been evaluated on the basis of the peeling conditions. A width of a peeling line (white background line) appearing at the fold is less than or equal to 0.5 mm was rated as "Good", whereas a width of the white line exceeds 0.5 mm was rated as "Poor".

(2) Example (Fixing Device)

A fixing device for use is made up of: a laser array constructed by arranging 1000 pieces of semiconductor laser elements that are 150 mW in power rating for applying fundamental laser light having an emission wavelength of 780 nm; a light condensing lens; a wavelength conversion element for conversion of fundamental laser light (having lithium tantalate crystal as wavelength conversion crystal); a conveying belt formed by blending an electrically conductive agent into polyvinylidene fluoride (light transmittance: 90% at 780 nm and 84% at 390 nm); and a bias power supply for applying a bias voltage to the back side of the conveying belt to cause electrostatic attraction of recording sheets. This fixing device is an example of the laser fixing device according to the invention.

(Production of Developer Containing Ultraviolet-Fixable Toner (Developer 1))

A cyan pigment material (Pigment Blue 15:3, Hostaperm blue B2G manufactured by Clariant JAPAN) in an amount of 40% by weight was added to polyester resin having a glass transition temperature Tg of 63° C., a half-flow softening temperature Tm (at which half the material flows out) of 109° C., and a refractive index of 1.57. The resultant admixture has been melt-kneaded and dispersed by a pressurizing kneader and a two-roll mill to form a masterbatch.

Next, 80.6 parts of polyester resin (63° C. in glass transition temperature Tg, 109° C. in half-flow softening temperature Tm, 1.57 in refractive index, 11000 in weight average molecular weight), 12.5 parts of the masterbatch, 2.5 parts of a light absorbing agent (resin obtained by copolymerization between a compound formed by introducing methacryloyl group into benzotriazole skeleton and methacrylate (365 nm in maximum absorption wavelength), and 4 parts of a charge control agent have been mixed uniformly by SUPERMIXER. Then, the admixture has been melt-kneaded by a two-roll mill (KNEADEX MOS 140-800 manufactured by Mitsui Mining Co., Ltd.). The resultant kneaded product has been cooled down, and whereafter subjected to fine pulverization in a jet mill and classification in a wind-power classifier.

Then, 100 parts of particles obtained as the result of classification, 1.0 part of hydrophobic fine silica particles (100 nm in particle size), and 1.5 parts of a titanium compound (10 nm in particle size) have been mixed together to prepare a toner having negative frictional charge characteristics. Note that the hydrophobic fine silica particles have been surface-treated with a silane coupling agent and dimethyl silicone oil.

Lastly, the toner thus obtained and a carrier have been mixed together to form a developer (Developer 1) containing an ultraviolet-fixable toner. Ferrite particles were used as the carrier, and the concentration of the toner in the developer was set at 4.0%.

(Image Formation and Evaluation)

An image in an unfixed state was formed by using Developer 1, and the image was then fixed by the above-mentioned fixing device. The fixing device has been so adjusted that fundamental laser light is incident on the wave conversion element and a second harmonic is emitted therefrom during the fixing operation. According to the results of evaluations on glossiness, image density and fixability, the glossiness was evaluated as "Good", the image density was evaluated as "Good", and the fixability was evaluated as "Good".

(Production of Developer Containing Infrared-Fixable Toner (Developer 2))

A developer containing an infrared-fixable toner (Developer 2) was formed substantially in the same manner as that for the formation of Developer 1, except that the additive amount of polyester resin is 81.1 parts, the additive amount of masterbatch is 12.5 parts, and 2.0 parts of cyanine pigment (800 nm in maximum absorption wavelength) are used as the light absorbing agent).

(Image Formation and Evaluation)

An image in an unfixed state was formed by using Developer 2, and the image was then fixed by the above-mentioned fixing device. The fixing device has been so adjusted that fundamental laser light is not incident on the wave conversion element. According to the results of evaluations on glossiness, image density and fixability, the glossiness was evaluated as "Good", the image density was evaluated as "Good", and the fixability was evaluated as "Good".

As described heretofore, the above-mentioned fixing device according to the invention is adapted to use of both an ultraviolet-fixable toner and an infrared-fixable toner.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A laser fixing device adapted to use of two types of light fixable toners having different light absorption characteristics, comprising:
a laser light emitting section for emitting laser light; and
a wavelength conversion section for emitting outgoing light having a wavelength different from the one that incident laser light has,
the laser light being applied to one of the two light fixable toners and the outgoing light which is emitted from the wavelength conversion section being applied to the other toner,
the laser light emitting section being configured to emit an infrared ray as the laser light,
the wavelength conversion section being configured to emit an ultraviolet ray as the outgoing light emitted from the wavelength conversion section, and
the wavelength conversion section being an SHG element employing quasi phase matching.

2. The laser fixing device of claim 1, further comprising a conveying section for conveying a recording medium to a location which is irradiated with the laser light and the outgoing light emitted from the wavelength conversion section,
wherein the conveying section exhibits, at least at its part irradiated with the laser light and the outgoing light emitted from the wavelength conversion section, an infrared transmittance of greater than or equal to 70% and an ultraviolet transmittance of greater than or equal to 80%.

* * * * *